(12) United States Patent
Roosli

(10) Patent No.: US 8,364,319 B2
(45) Date of Patent: Jan. 29, 2013

(54) SMART WALL BOX

(75) Inventor: Philipp Roosli, Niantic, CT (US)

(73) Assignee: Inncom International Inc., Niantic, CT (US)

( * ) Notice: Subject to any disclaimer, the term of this patent is extended or adjusted under 35 U.S.C. 154(b) by 832 days.

(21) Appl. No.: 12/406,210

(22) Filed: Mar. 18, 2009

(65) Prior Publication Data

US 2010/0236824 A1 Sep. 23, 2010

Related U.S. Application Data

(60) Provisional application No. 61/046,577, filed on Apr. 21, 2008.

(51) Int. Cl.
*G06F 19/00* (2011.01)
(52) U.S. Cl. ........................ 700/277; 318/280
(58) Field of Classification Search .................. 700/291, 700/277, 298; 318/280; 166/116.1; 236/46 B, 236/78 R, 68 B; 307/112, 115; 340/3.5, 340/825.52
See application file for complete search history.

(56) References Cited

U.S. PATENT DOCUMENTS

| | | | | |
|---|---|---|---|---|
| 5,982,103 | A * | 11/1999 | Mosebrook et al. | 315/149 |
| 6,293,697 | B1 * | 9/2001 | Gul | 374/135 |
| 6,738,382 | B1 * | 5/2004 | West et al. | 370/401 |
| 6,798,341 | B1 * | 9/2004 | Eckel et al. | 340/521 |
| 6,967,565 | B2 * | 11/2005 | Lingemann | 340/12.23 |
| 7,274,117 | B1 * | 9/2007 | Viola et al. | 307/112 |
| 7,391,297 | B2 * | 6/2008 | Cash et al. | 340/3.5 |
| 7,466,090 | B2 * | 12/2008 | Meewis et al. | 318/280 |
| 7,573,205 | B2 * | 8/2009 | Hosaka et al. | 315/277 |
| 7,589,639 | B2 * | 9/2009 | Fair et al. | 340/660 |
| 2003/0102979 | A1 * | 6/2003 | Jednacz et al. | 340/825.52 |
| 2004/0176877 | A1 * | 9/2004 | Hesse et al. | 700/276 |
| 2004/0267385 | A1 * | 12/2004 | Lingemann | 700/83 |
| 2005/0049726 | A1 * | 3/2005 | Adamson et al. | 700/19 |
| 2005/0049730 | A1 * | 3/2005 | Adamson et al. | 700/83 |
| 2005/0090915 | A1 * | 4/2005 | Geiwitz | 700/90 |
| 2006/0112421 | A1 * | 5/2006 | Beierwalters et al. | 726/5 |
| 2007/0087020 | A1 * | 4/2007 | O'Connor | 424/265.1 |
| 2007/0108280 | A1 * | 5/2007 | Li et al. | 235/451 |

FOREIGN PATENT DOCUMENTS

| | | |
|---|---|---|
| JP | 2000-262170 A | 9/2000 |
| KR | 1020060122021 A | 11/2006 |

* cited by examiner

*Primary Examiner* — Kidest Bahta
(74) *Attorney, Agent, or Firm* — Seager Tufte & Wickhem LLC

(57) ABSTRACT

A building automation system is provided and includes a wall box of a building, a control device configured to be mounted on the wall box, the control device including a micro controller and a memory, the memory having executable instructions stored thereon, which, when executed, cause the micro controller to control an environmental condition within the building, and a configuration memory unit, mounted on the wall box and external from the control device, the configuration memory unit including information stored thereon for configuring the control device, wherein, when executed, the executable instructions further cause the micro controller to access the information when the control device is mounted within the wall box and to configure the control device in accordance with the information.

21 Claims, 3 Drawing Sheets

SMART WALL BOX

CROSS REFERENCE TO RELATED APPLICATIONS

This application claims the benefit of priority to U.S. Provisional Patent Application Ser. No. 61/046,577, filed Apr. 21, 2008, the entire contents of which are incorporated herein by reference.

BACKGROUND OF THE INVENTION

Aspects of the present invention are directed to installing and maintaining building control equipment.

A typical building automation system includes a number of distributed devices that are interconnected with wired and wireless communication technology. Adding communication capabilities to such devices allows for the creation of applications that transcend the capabilities of a single device. For example, the communication capabilities make it possible to establish a light scene using two or more communicating light control devices. Networked devices also have the ability to report status and alarm conditions to other parts of the system. For example, a controller or server can track messages from the devices and, therefore, have the ability to monitor and control these devices from remote locations.

During the installation of building automation products, the installer is tasked to configure the devices such that each device is given a network address and other network configuration parameters, such as frequency channels or logical network identifier for wireless communication, etc. Still other necessary parameters may be application specific, such as minimal and maximal dim brightness for light dimmers, minimal and maximal target temperature range for thermostats or equipment driving parameters for HVAC or window treatment actuators. As such, the installation process must be performed by trained and supervised personal and cannot be considered as having been completed until a final commissioning procedure is conducted at the end of the installation to provide assurances that the building control system is handed over to the customer in working condition.

During the lifetime of the typical building automation system, components of the system can fail and will have to be replaced. Common failure modes are observed in electrical components that actuate an electrical load, such as a triac in a light dimmer or a relay for an HVAC actuator, and in power supply components, such as where a power supply of a device fails due to a line voltage spike. Devices that an end user can touch are also prone to mechanical abuse and such devices might have to be replaced not because of a functional failure but for esthetic reasons. With this said, it is rarely observed that the failure mode is due to a break-down of a configuration memory device within the device. The reason for this is that the memory is a solid-state component and does not contain any parts that can wear out.

In most applications, when a device fails, the repair will be performed by a person that is not expertly trained on the system since the repairs generally only involve the simple replacement of the device. However, in light of this fact, the repair person is required to removes the physical hardware of the device to be replaced along with the configuration memory as well. This drawback in current systems is due to the fact that the configuration memory is an intrinsic part of the device itself and requires that once the new device has been installed, it will have to be configured properly so that the full application of the device can be restored.

BRIEF DESCRIPTION OF THE INVENTION

According to one aspect of the invention, a building automation system is provided and includes a wall box of a building, a control device configured to be mounted on the wall box, the control device including a micro controller and a memory, the memory having executable instructions stored thereon, which, when executed, cause the micro controller to control an environmental condition within the building, and a configuration memory unit, mounted on the wall box and external from the control device, the configuration memory unit including information stored thereon for configuring the control device, wherein, when executed, the executable instructions further cause the micro controller to access the information when the control device is mounted within the wall box and to configure the control device in accordance with the information.

According to another aspect of the invention, a control device to be mounted on a wall box of a building is provided and includes a micro controller and a memory having executable instructions stored thereon, which, when executed following the mounting, cause the micro controller to control an environmental condition within the building, wherein, when executed following the mounting, the executable instructions further cause the micro controller to access information for configuring the control device and to configure the control device in accordance with the information.

According to yet another aspect of the invention, a method of installing a building automation system is provided and includes manufacturing a wall box, including a receiving unit, to be disposed within a wall of a building, installing a configuration memory unit, including information stored thereon for configuring a control device, on the wall box, and mounting the control device within the receiving unit, the control device including a micro controller and a memory, the memory having executable instructions stored thereon, which, when executed, cause the micro controller to control an environmental condition within the building, to access the information when the control device is mounted within the receiving unit and to configure the control device in accordance with the information.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

This invention is directed to installing and maintaining building control equipment in residential and commercial environments. Particularly, the invention provides for storing of configuration data of a building automation device external to the device and attached to the install location, such as an electrical wall box. On replacing such device, the new device will not be required to be configured as the configuration will be reused from the previous device.

Figure 1:
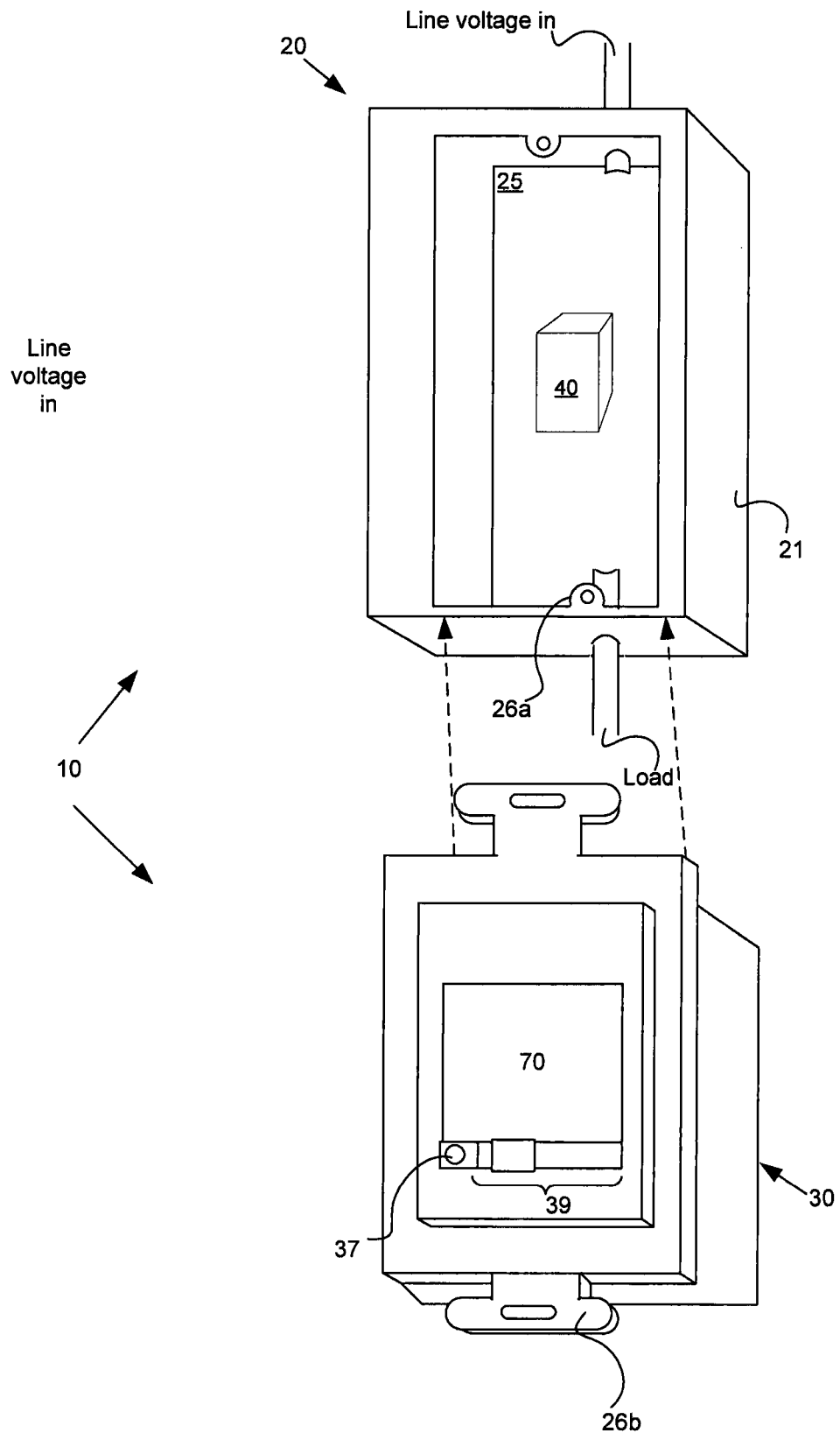
FIG. 1 is an exploded perspective view of a wall box and a control device in accordance with embodiments of the present invention.
Figure 2:
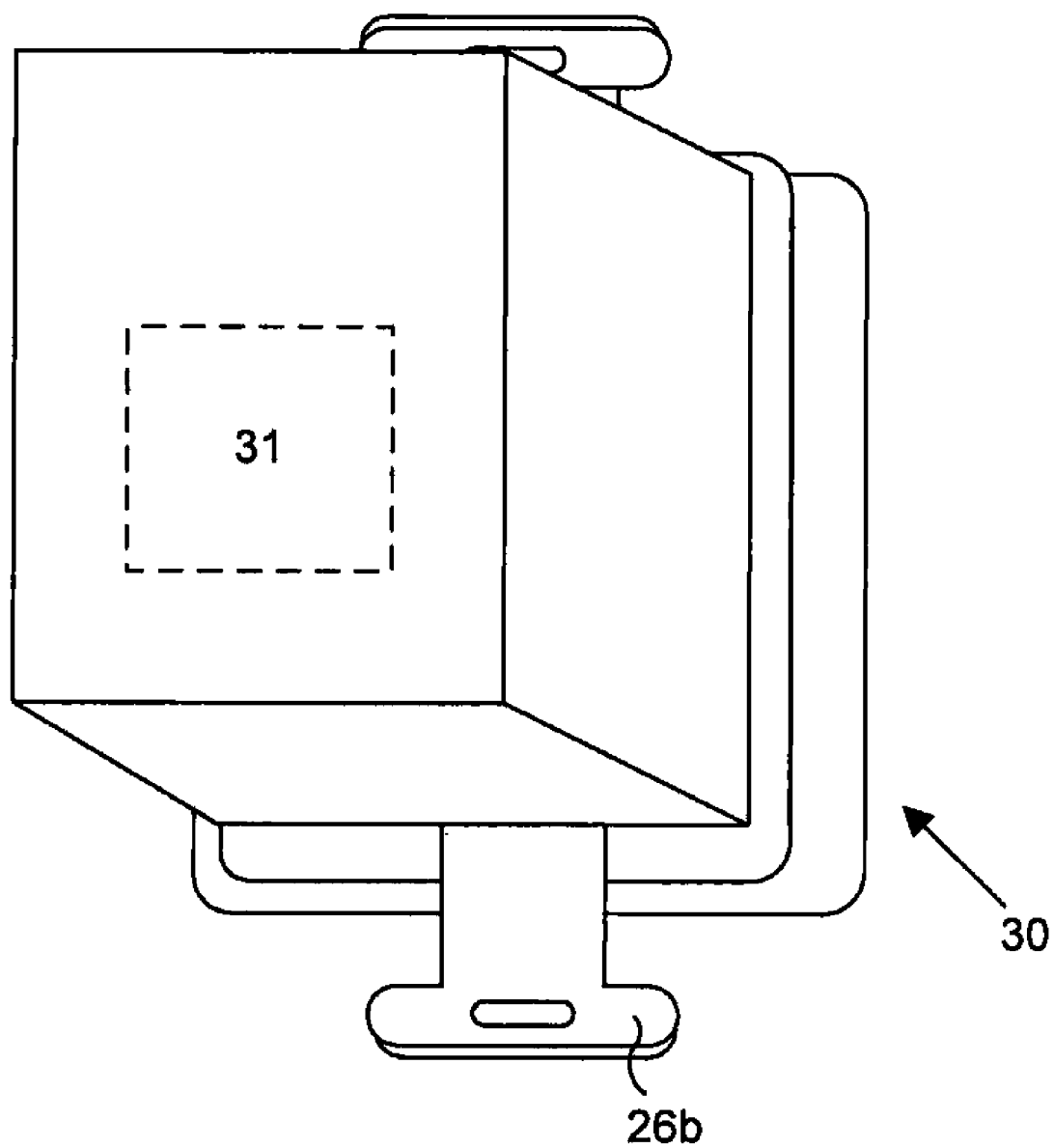
FIG. 2 is a rear perspective view of the control device of FIG. 1.
Figure 3:
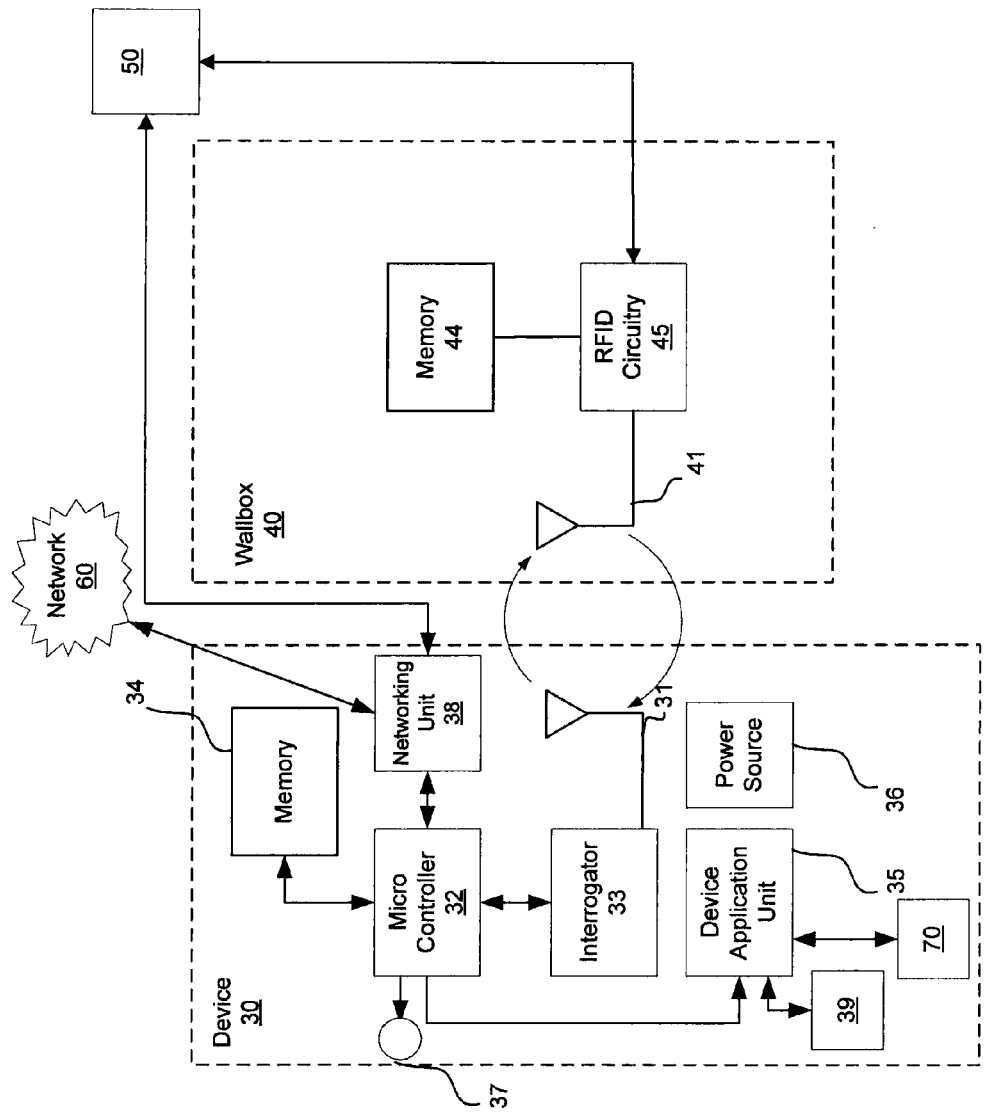
FIG. 3 is a schematic illustration of the control device of FIG. 1 and a configuration memory unit in accordance with embodiments of the present invention.

With reference to FIGS. 1-3, a building automation system 10 for use with a building, such as a residence, a hotel or an office building, is provided. The system 10 includes a wall box 20, a control device 30 and a configuration memory unit 40. The wall box 20 may be installed anywhere within the building but, generally, will be installed within a wall of the building for aesthetic purposes. As installed, the wall box 20 will be coupled in a well known manner to wiring, such as an inputted line voltage and an outputted load. The wall box 20 further includes sidewalls 21 that have a sufficient shape and size to define a receiving unit 25 generally within an interior of the wall box 20.

The control device 30 is configured to be mounted within the receiving unit 25 and may serve to control an environmental condition, such as formation of a lighting scene, within the building. The control device 30 includes a micro controller 32 and a memory 34. The memory 34 includes random access memory (RAM) units, read-only memory (ROM) units and/or other forms of storage units on which executable instructions are stored. When executed, these executable instructions cause the micro controller 32 to control the environmental condition.

In addition, the control device 30 may further include a device application unit 35 and a user interface 39. The device application unit 35 is coupled to the micro controller 32 and allows the microcontroller 32 to issue signals that control the environmental condition. The user interface 39 may include a slider that slides along a track, as shown, or some other user manipulated device and is coupled to the device application unit 35 such that a user of the control device 30 is able to input control commands to the micro controller 32.

The control device 30 may be provided in wireless or wired communication with the configuration memory unit 40. Where wireless communication is employed, the control device 30 includes an antenna 31, to transmit and receive wireless signals, and an interrogator 33, which is coupled to the micro controller 32, to control the antenna 31. The configuration memory unit 40 includes a complementary an antenna 41 and radio frequency identification (RFID) circuitry 45. Where the control device 30 is wired to the configuration memory unit 40, the interrogator 33 is directly wired to the RFID circuitry 45.

The control device 30 may be line powered, in which case the control device 30 draws power from, e.g., the line voltage or some other external power source. Additionally or alternately, the control device 30 may be battery powered. Where the control device 30 is battery powered, the control device 30 includes a power source 36, such as a lithium-ion battery or some other replaceable and/or rechargeable battery.

The control device 30 may also be configured to communicate with external devices. For example, where the control device 30 is a light dimmer that allows a hotel guest to dim or brighten his living space in his hotel room, the control device 30 may be configured to communicate with a light dimmer for the bathroom of the hotel room. In this case, the bathroom light dimmer could be instructed to dim or brighten the bathroom lights when a similar action is taken by the guest with respect to the living space lights. Such communications between the control device 30 and the external device may be conducted via radio frequencies or by way of optics. In any case, the control device 30 may further include a networking unit 38, which is coupled to the micro controller 32 and which is configured to manage the communications.

The configuration memory unit 40 is installed on the wall box 20 at a position which is external from the control device 30 and includes memory 44, such as RAM units, ROM units and/or other similar types of storage, which is coupled to the RFID circuitry 45. In this way, the configuration memory unit 40 is configured to include at least information for configuring the control device 30. That is, when the control device 30 is mounted within the receiving unit 25, the executable instructions stored in the memory 34 are executed and cause the micro controller 32 to access the information of the memory 44 of the configuration memory unit 40. The information is then used by the micro controller 32 to configure the control device 30.

The configuration memory unit 40 may be installed on the wall 20 box during a manufacture thereof before, during or following the installation of the wall box 20 in the building. The configuration memory unit 40 may be screwed or, alternately, glued to the sidewalls 21 of the wall box 20. The wall box 20 may have varied forms and may include additional features. For example, the wall box 20 may include an electrical installation box in which the sidewalls 21 are formed such that the receiving unit 25 is disposed on a top thereof Further, surfaces of the sidewalls 21 may include a mounting plate 26a to which a mount bracket 26b of the control device 30 is coupled for support.

When the control device 30 is mounted within the receiving unit 25 of the wall box 20, the control device 30 is disposed in signal communication with the configuration memory unit 40. In this condition, the control device 30 may be provided with read and/or write access to the memory 44.

The information stored in the memory 44 may include at least one of a network address for use with the control device 30, operation parameters for the control device 30, a description of the control device 30, a description of mandatory hardware attributes of the control device 30, a description of mandatory firmware features of the control device 30 and a description of a type of load being affected by the control device 30. Where a replacement control device is mounted within the receiving unit 25, if it is determined that the replacement device is incompatible with this information, the replacement device may not be operable. For example, if the replacement device does not include the mandatory hardware attributes, the mandatory firmware features or is not compatible with the type of the load, the replacement device may be non-operative or rejected. As another example, if the information indicates that the control device 30 is a light dimmer but the replacement control device does not match that description, the replacement control device will be recognized as not comporting with the description and will be inoperable as a result.

In an event the control device 30 does not match up with the information of the memory 44, the micro controller 32 may automatically configure the control device 30 in accordance with a default configuration. Alternately, the micro controller 32 may activate an audible alarm or a visible alarm, such as a light emitting diode (LED) 37, disposed on a surface of the control device 30.

The configuration memory unit 40 may, in some cases, be programmable such that the information is changed or modified. In accordance with embodiments of the invention, this programming of the configuration memory unit 40 may be accomplished via the user interface 39 of the control device 30 and/or a liquid crystal display (LCD) 70. Alternately, the programming could be accomplished with a hand held configuration device 50 that communicates directly with the control device 30 and/or the configuration memory unit 40 and/or via a network 60 to which the control device 30 is connected.

In accordance with another aspect of the invention, a control device 30 for mounting in a building is provided. As described above, the control device 30 includes a micro controller 32 and a memory 34. The memory 34 has executable instructions stored thereon, which, when executed following the mounting of the control device 30, cause the micro controller 32 to control an environmental condition within the building. In addition, when executed following the mounting, the executable instructions further cause the micro controller 32 to access information for configuring the control device 30 and to configure the control device 30 in accordance with the information. Here, a building automation system 10 includes a wall box 20 disposed within a wall of a building to include a receiving unit 25, the control device 30, which is mounted within the receiving unit 25 and a configuration memory unit 40, installed on the wall box 20 external from the control device 30. As mentioned above, the configuration memory unit 40 includes the information for configuring the control device 30 stored thereon.

In accordance with yet another aspect of the invention, a method of installing a building automation system 10 is provided and includes manufacturing a wall box, including a receiving unit, to be disposed within a wall of a building, installing a configuration memory unit, including information stored thereon for configuring a control device, on the wall box, and mounting the control device within the receiving unit. In accordance with the method and as described above, the control device includes a micro controller and a memory, with the memory having executable instructions stored thereon, which, when executed, cause the micro controller to control an environmental condition within the building, to access the information when the control device is mounted within the receiving unit and to configure the control device in accordance with the information. The method may further include providing for wired and/or wireless communications between the control device and external devices.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A building automation system, comprising:
a wall box of a building;
a control device configured to be mounted on the wall box, the control device including a micro controller and a memory, the memory having executable instructions stored thereon, which, when executed, cause the micro controller to control an environmental condition within the building; and
a configuration memory unit, mounted on the wall box and external from the control device, the configuration memory unit including information stored thereon for configuring the control device,
wherein, when executed, the executable instructions further cause the micro controller to access the information when the control device is mounted within the wall box and to configure the control device in accordance with the information.

2. The system according to claim 1, wherein the wall box comprises an electrical installation box onto a top of which the control device is mounted.

3. The system according to claim 1, wherein the wall box comprises a surface mount bracket onto which the control device is mounted.

4. The system according to claim 1, wherein the control device is provided with at least one of read and write access to the configuration memory unit.

5. The system according to claim 1, wherein the configuration memory unit is installed on the wall box during a manufacture of the wall box.

6. The system according to claim 1, wherein the configuration memory unit is screwed to the wall box.

7. The system according to claim 1, wherein the configuration memory unit is glued to the wall box.

8. The system according to claim 1, wherein the configuration memory unit is wired to the control device when the control device is mounted.

9. The system according to claim 1, wherein the configuration memory unit comprises a radio frequency identification (RFID) device.

10. The system according to claim 1, wherein the information comprises at least one of a network address for the control device, control device operation parameters and control device description information.

11. The system according to claim 1, wherein the information comprises at least one of a description of mandatory hardware attributes, a description of mandatory firmware features and a description of a type of load to be controlled.

12. The system according to claim 11, wherein a replacement control device lacking the mandatory hardware attributes or the mandatory firmware features, or which does not support the type of the load is non-operative.

13. The system according to claim 1, wherein the control device is at least one of line and battery powered.

14. The system according to claim 1, wherein the control device is configured to communicate with an external device.

15. The system according to claim 14, wherein the control device communicates with the external device via at least one of radio frequencies, optics and wiring.

16. The system according to claim 1, wherein the configuration memory unit is at least one of manually programmable via the control device, programmable with a hand held configuration device and programmable via a network to which the control device is connected.

17. A control device to be mounted on a wall box of a building, the control device comprising a micro controller and a memory having executable instructions stored thereon, which, when executed following the mounting, cause the micro controller to control an environmental condition within the building, wherein, when executed following the mounting, the executable instructions further cause the micro controller to access information for configuring the control device and to configure the control device in accordance with the information.

18. A building automation system comprising the control device of claim 17 and a configuration memory unit mounted on the wall box external from the control device, the configuration memory unit including the information for configuring the control device stored thereon.

19. A method of installing a building automation system, comprising:

manufacturing a wall box, including a receiving unit, to be disposed within a wall of a building;

installing a configuration memory unit, including information stored thereon for configuring a control device, on the wall box; and mounting the control device within the receiving unit, the control device including a micro controller and a memory, the memory having executable instructions stored thereon, which, when executed, cause the micro controller to control an environmental condition within the building, to access the information when the control device is mounted within the receiving unit and to configure the control device in accordance with the information.

20. The method according to claim 19, further comprising providing for communications between the control device and external devices.

21. A building automation system, comprising:

a wall box of a building;

a control device configured to be mounted on the wall box, the control device including a micro controller and a memory, the memory having executable instructions stored thereon, which, when executed, cause the micro controller to control an environmental condition within the building; and a configuration memory unit, mounted on the wall box and external from the control device, the configuration memory unit including information stored thereon for configuring the control device such that the information is stored externally from the control device, wherein, when executed, the executable instructions further cause the micro controller to access the information when the control device is mounted within the wall box and to configure the control device in accordance with the information, the system further comprising a replacement control device to replace the control device, the configuration of the control device by the executable instructions being reused to configure the replacement control device.

* * * * *